(12) United States Patent
Harper, Jr.

(10) Patent No.: US 6,353,191 B1
(45) Date of Patent: Mar. 5, 2002

(54) COLUMN GRID ARRAY CONNECTOR

(75) Inventor: Donald K. Harper, Jr., Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/460,008

(22) Filed: Dec. 13, 1999

(51) Int. Cl.[7] ........................... H01R 12/04; H05K 1/11
(52) U.S. Cl. ........................................ 174/267; 439/74
(58) Field of Search .................... 439/44–48, 65–75; 174/267, 260

(56) References Cited

U.S. PATENT DOCUMENTS

| | | | |
|---|---|---|---|
| 3,601,662 A | * 8/1971 | De Barros | 317/101 |
| 4,419,814 A | 12/1983 | Hasserjian | 29/605 |
| 5,244,143 A | 9/1993 | Ference et al. | 228/180.21 |
| 5,324,892 A | * 6/1994 | Granier et al. | 174/250 |
| 5,334,804 A | * 8/1994 | Love et al. | 174/267 |
| 5,639,696 A | 6/1997 | Liang et al. | 437/209 |
| 5,641,990 A | 6/1997 | Chiu | 257/737 |
| 5,690,270 A | 11/1997 | Gore | 228/180.22 |
| 5,791,911 A | 8/1998 | Fasano et al. | 439/63 |
| 5,911,583 A | 6/1999 | Roybal et al. | 439/66 |
| 6,042,389 A | * 3/2000 | Lemke et al. | 439/74 |
| 6,049,039 A | * 4/2000 | Fushimi | 174/68.1 |

OTHER PUBLICATIONS

Lau, J.H. (ed.), in *Ball Grid Array Technology*, 1995, p. 145.

* cited by examiner

Primary Examiner—Albert W. Paladini
Assistant Examiner—Jeremy Norris
(74) Attorney, Agent, or Firm—Woodcock Washburn LLP

(57) ABSTRACT

An electrical connector apparatus for establishing a connection between an electrical connector and a substrate. A column of solder is disposed about a tail portion of a terminal of the electrical connector to form a solder column. The solder column being adapted for making an electrical contact between the electrical connector and the substrate. Increasing the height of the solder column improves compliance in the connection between the terminal and the substrate. This feature of improved compliance allows the terminal to absorb higher stresses present between the substrate and the connector body thereby avoiding fracture of the solder joint between the terminal and the substrate. In addition, the terminal tail acts to reinforce the solder column and this metal core of the solder column increases the mechanical properties of the attachment between the connector body and the substrate. A method of forming the solder column is also disclosed.

13 Claims, 6 Drawing Sheets

COLUMN GRID ARRAY CONNECTOR

FIELD OF THE INVENTION

This invention relates generally to the field of electrical connectors, and particularly to an apparatus for establishing a mechanical and electrical connection between an electrical connector and a substrate, such as a Printed Circuit Board (PCB), and a method of attaching a column of solder to a connector terminal to form a solder column.

BACKGROUND

The electrical terminals of a connector may be mechanically and electrically connected to electrical contact pads on a PCB by several conventional methods, including a pin grid array (PGA), land grid array (LGA), and ball grid array (BGA). In addition, the circuit industry connects packages to a substrate by any of the above methods, as well as column grid array (CGA). The present invention is directed at improving the reliability of the mechanical/electrical connection formed between an electrical connector and a substrate, such as a PCB.

In the electrical connector industry, a Ball Grid Array (BGA) type of electrical connector typically has a plurality of solder balls that interconnect the connector to a PCB. A typical BGA connector consists of a substrate having an array of electrical contact pads or traces disposed about the substrate's surface. Using existing techniques, spherical shaped solder balls are attached to the terminals of the connector by first applying a resin flux to the electrical contact pads, positioning the solder balls onto the electrical contact pads, and running the connector through a reflow furnace. During the reflow process the solder balls are held in position by the flux and wetted onto the electrical contact pads. In addition to holding the solder balls in position, the flux promotes the wetting of the solder balls to the contact pads and chemically cleans the contact pad surfaces.

After having passed through the reflow furnace, the solder portion located near the solder ball and electrical contact pad interface flows to form an electrical and mechanical connection, but in all other respects, the solder balls generally maintain their spherical shape. In lieu of using resin flux, other methods are known that utilize supporting fixtures to hold the solder balls in position during reflow with or without the use of flux.

One problem associated with using solder balls is that, because of their spherical shape, they tend to form short connections that have generally short lengths which may break under stress. As a result, the electrical connection may be interrupted between the connector and the PCB.

In the integrated circuits and in the packaging industries, other methods are also used to form the electrical and mechanical connection between an electronic package and a substrate. One such method currently used for ceramic microprocessor packaging includes the use of Ceramic Column Grid Array (CCGA). The CCGA adds additional height (e.g., physical distance) to the connection that results in additional compliance. In particular, CCGA is most often used in the microelectronics industry in applications where large packages are involved.

A problem associated with the use of CCGA for connection of an electrical connector to a PCB is the difference in how each component reacts to temperature changes. The coefficient of thermal expansion (CTE) is a number that represents the dimensional change of a material per degree of temperature change. By way of example, in a typical connection between an electrical connector and a PCB, a different CTE will exist as between the connector material, the material of the solder joint, and the PCB material. Area array components (connectors/devices/packages, etc.) are typically limited in size based on the effects of differential CTE of the associated materials. This relates to the performance and reliability of the electrical connections. The greater the differential displacements created by CTE mismatch during thermal changes the greater concern for the electrical integrity of the system.

Typically, a well accepted mounting arrangement for mounting a surface mount electrical connector having terminals depending therefrom is to solder each of the metallic terminals onto a copper clad contact pad on the PCB material using a lead and tin alloy solder paste. The thermal profile during solder paste reflow typically exceeds 200° C. for short periods of time. The CTE of the epoxy and glass PCB material is different than the CTE of the metallic material of the terminal and is usually also different than the CTE of the solder alloy that joins the two. Effects of this thermal mismatch are first encountered during the cool down period after the solder is reflowed during initial attachment. The molten solder will solidify just below 200° C., and at that time the assembly is mechanically fixed and as near stress free as possible. As the temperature continues to decrease, the differing expansion rates begin to become a factor. The PCB material, the solder alloy, and the electrical connector all react at different rates to this change in temperature. As the relative locational association of the solder pads between the terminal and the PCB begins to change, mechanical stress increases in all three components (the connector, the PCB, and the solder joint).

CCGAs include a plurality of solid solder columns that are positioned between the electrical contact pads of a package and a PCB. The connection between the electrical contact pads on a package and PCB are generally formed by first applying a resin flux to the electrical contact pads, positioning the solder columns over the pads, and running the unit through a reflow furnace. The solder column height, which is greater than the diameter of a typical solder ball, allows for greater flexibility in establishing the connection between a package and a PCB. By allowing for greater flexibility, the solder columns reduce stresses at the solder column/electrical contact pad interfaces which, in turn, results in higher product reliability.

Increasing the height of a column with a fixed footprint spreads the total stress over a greater mass and ultimately decreases the stress per unit mass. The column addresses the relative movement between the connector and the PCB by bending as opposed to shearing.

In addition, a problem exists as to how to maintain the proper coplanarity between the mounting surfaces of the connector and substrate, especially as the size of the electrical connector increases. Conventional methods do not provide a method of establishing a coplanar soldering surface regardless of substrate flatness.

What is still needed is an apparatus and method which solve the aforementioned problems associated with forming reliable connections between an electrical connector and a PCB. As will be seen, the present invention provides an improved apparatus and method for forming column grid arrays which solve the aforementioned problems.

SUMMARY

The present invention is directed to an electrical connector having a column grid array for connecting an electrical connector to a substrate, such as a PCB. This invention provides the benefits of a solder column to provide a compliant connection between an electrical connector and a substrate, thereby increasing the reliability of the connection, particularly for increasing connector sizes. The solder column is formed such that a portion of the terminal extends into the column of solder. This provides mechanical rigidity to the solder column while at the same time also providing a compliant connection between the connector and the PCB.

The electrical connector apparatus for establishing a connection between a terminal and a substrate has a column of solder that is attached to at least a portion of the distal end of the tail of an electrical contact terminal of the connector. The column of solder is attached to the tail to form a solder column which is adapted for making an electrical and mechanical connection with an electrical contact pad or trace on the substrate. Increasing the height of the solder column improves compliance in the connection between the terminal and the substrate. This feature of improved compliance allows the terminal to absorb higher stresses present between the substrate and the connector body thereby avoiding fracture of the solder joint between the terminal and the substrate. In addition, the terminal tail acts to reinforce the solder column and this metal core of the solder column increases the mechanical properties of the attachment between the connector housing and the substrate.

BRIEF DESCRIPTION OF THE DRAWINGS

These and other features, aspects, and advantages of the present embodiment of the invention will become better understood with regards to the following description, appended claims, and accompanying drawings where:

DETAILED DESCRIPTION OF THE PREFERRED EMBODIMENTS

Figure 1:
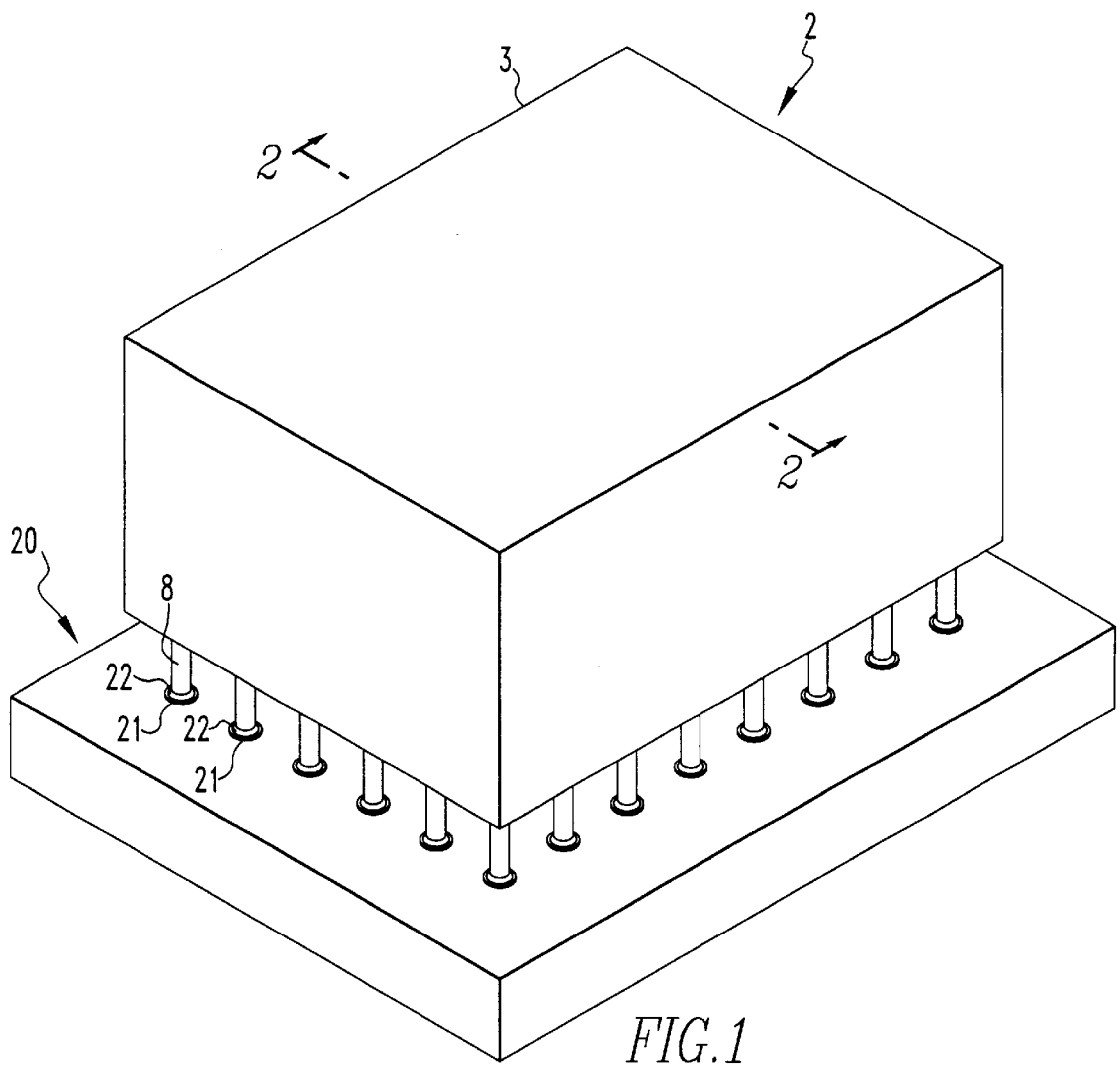
FIG. 1 is a perspective view of an exemplary embodiment of an electrical connector connected to a substrate.
Figure 2:
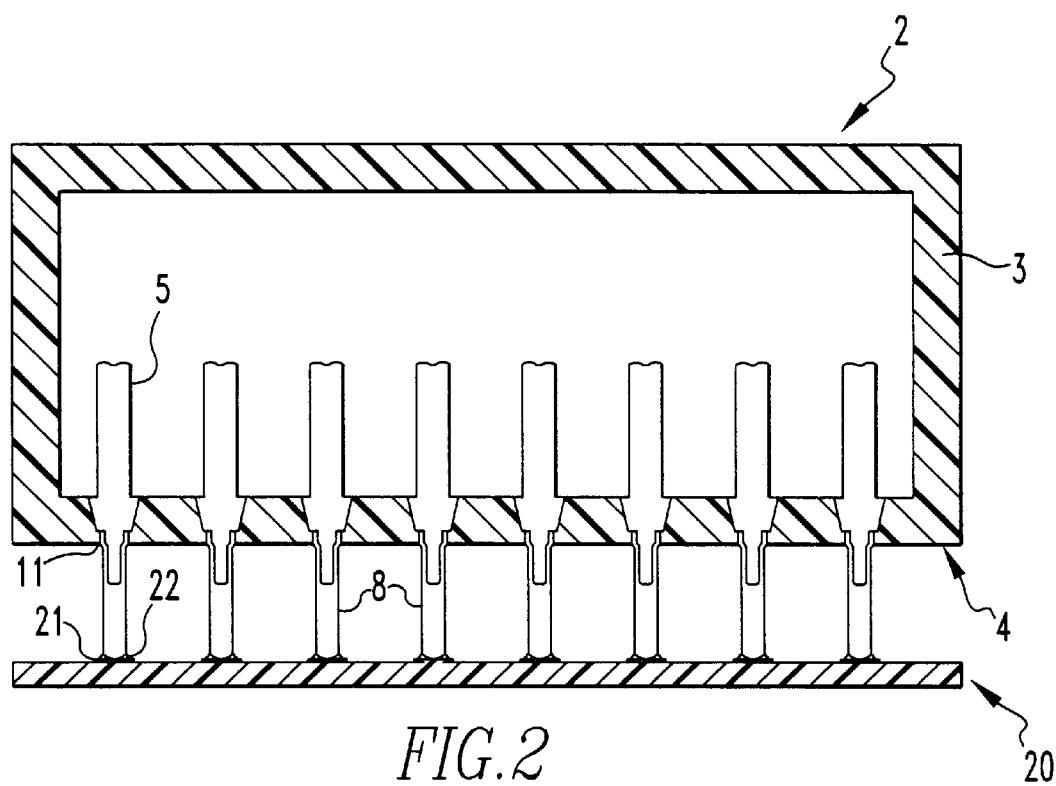
FIG. 2 is a cross-sectional view of FIG. 1 showing the connection between the connector and the substrate.

Throughout the following detailed description similar reference numbers refer to similar elements in all the figures of the drawings. With reference to FIGS. 1 through 4, shown is an exemplary embodiment of the column grid array connector of the present invention. With reference to FIGS. 5 through 8, shown is an exemplary method of disposing a column of solder about a tail portion of a terminal of an electrical connection.

The present invention provides an apparatus adapted to form an improved connection between an electrical connector 2 and a substrate 20. This invention provides a solder column 8 that addresses the primary obstacles that are presented with large area array components, including CTE mismatch and coplanarity, by providing a more compliant connection between the electrical connector 2 and the substrate 20. In addition, the present invention provides an improved process for attaching columns of solder 7 to the contact terminals 5 of the electrical connector 2 to form solder columns 8.

This invention is especially adapted for use with relatively large connectors having a high number of I/O terminals 5, and more particularly for connectors having large area array configurations that require increased I/O requirements along with increased density, such as electrical connectors over about 1000 positions and up to about 7000 positions. It relies on the concept of increasing the length or height of a solder column 8 so that there is greater compliance in the connection between the terminal 5 and the substrate 20. The increased compliance allows the terminal 5 and solder joint 24 to absorb higher stresses (usually resulting from the CTE mismatch of the print circuit board 20 and the connector housing 3) thereby avoiding fracture of the solder joint 24 between the terminal 5 and the printed circuit board 20. To this end, at least a portion of the tail portion 6 of the contact 5 extends into the column of solder 7 a predetermined distance thereby forming a solder column 8 which adds mechanical rigidity to the connection.

FIGS. 1 through 4 depict an electrical connector 2 including a connector housing 3 having a plurality of contact terminals 5 disposed therein and a mounting surface 4 formed thereon. Each of the individual terminals 5 has a tail portion 6 formed at a distal end. Tails 6 pass through respective openings 11 formed in mounting surface 4 and extend out from housing 3. Terminals 6 are formed of an electrically conductive material. Preferably, tails 6 are formed integral with terminals 5. Preferably, terminal tails 6 are formed from a metal material having a melting point greater than the melting point of the column of solder 7. The contact terminals 5 and tails 6 extend outward from opposite sides of housing 3 and the tails 6 are adapted for connection to substrate 20 through solder column 8.

Figure 3:
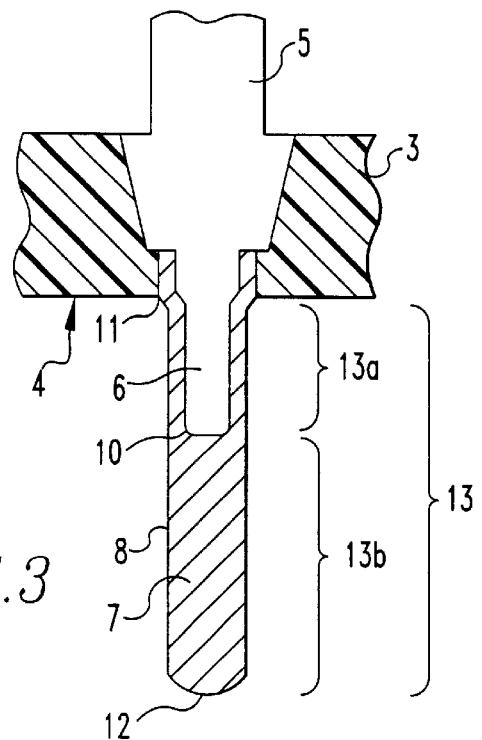
FIG. 3 is a detail of an exemplary solder column of FIG. 1 showing the tail portion of the connector contact forming a core of the solder column.
Figure 4:
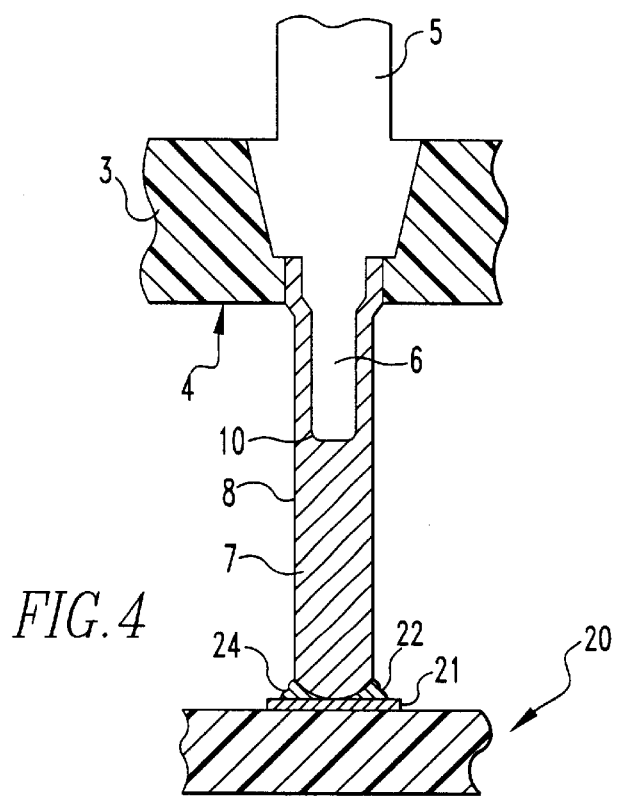
FIG. 4 is a detail of the connection of the solder column of FIG. 3 to a substrate.

As shown in FIG. 3, an extended column of solder 7 is disposed about tail portion 6 of each of the plurality of terminal contacts 5 such that the tail 6 of each terminal 5 extends over at least a portion of the column of solder 7 to form a solder column 8. The tail 6 extends a predetermined distance into a center region or core 10 of the column of solder 7 thereby forming solder column 8. Tail portion 6, by extending into the solder column 8, adds mechanical rigidity to the connection and allows the length 13 of solder column 8 to be extended thereby improving the compliance between connector 2 and substrate 20. This increased compliance allows the connection to absorb higher stresses thereby avoiding rupture of the solder joint 24.

The column of solder 7 is disposed about at least a portion of the tail portion 6. The longitudinal axis of tail 6 is oriented along the longitudinal axis of the solder column 8 and forms part of the longitudinal axis. The tail 6 thus forms a core 10 of the solder column 8. The solder column 8 has a tip 12 formed at its distal end that is adapted for connection to the substrate 20.

As mentioned, the tail 6 extends a predetermined distance into the column of solder 7 to form a core 10 of the solder column 8. The distance that the tail 6 extends into the solder column 8 depends on the particular application, but preferably the tail 6 extends into the solder column 8 a sufficient distance, such as between approximately 5–20% of the length of the solder column 8, to provide mechanical strength and rigidity to the connection, while at the same time providing a compliant mechanical connection between the connector 2 and the substrate 20.

Referring to FIG. 3, the solder column 8 is formed having an overall length 13. By extending the tail portion 6 into the solder column 8, the length 13 of the solder column 8 can be extended providing improved compliance. The solder column 8 is preferably formed such that more overall length 13 of the solder column 8 is formed of solder only. Accordingly, the overall length 13 of each of the solder columns 8 includes a first length 13*a* having the terminal tail portion 6 surrounded by the solder 7 and a second length 13*b* comprising solder 7 material only (e.g., no tail portion 6 in the center region). In this embodiment, the second length 13*b* makes up a greater percentage of the overall length 13 of the solder column 8. The first length 13*a* provides improved mechanical strength to the connection, while the second length 13*b* provides improved compliance to the connection.

The more the tail portion 6 extends into the column of solder 7 to form the core 10 of the solder column 8 (e.g., the greater percentage of the overall length 13 of the solder column 8 having the tail 6 as its core 10), the more rigid or stronger the mechanical connection will be. The more the overall length 13 of the solder column 8 that is solder material only, the more compliant the connection will be. Accordingly, depending on the particular application, the preferred distance that the tail extends into the solder column 8 must be determined to provide the desired mechanical rigidity while at the same time also maintaining the desired compliancy of the connection.

A purpose of the solder column 8 is to provide a compliant connection between the two pieces. The solder column 8 should preferably allow some motion/movement between the pieces and the solder column 8 acts to absorb this motion or offset between the pieces. For increased reliability and increased compliancy due to large Distance to Neutral Point (DNP), (for example, 800–1500 I.O. on 0.050 inch centerline) it is preferred to use a higher stand off produced by the use of a solder column 8.

The terminal tail 6 forming the core 10 of the solder column 8 acts to reinforce the solder column 8 and this metal core 10 of the solder column 8 increases the mechanical properties of the attachment between the connector 2 and the substrate 20. The metal core 10 of the tail 6 also helps prevent collapse of the solder column 8 during the reflow process.

Increasing the length 13 of the solder column 8 further improves compliance in the connection between the connector 2 and the substrate 20. Preferably, in connectors with about a 1.00 mm or about a 1.27 mm pitch, solder column 8 has a diameter of about 0.020–0.0225 inch and a length of about 0.050 inch in a first embodiment and about 0.087 inch in a second embodiment. The inductance and electrical characteristics of the solder column 8 have been found to be more preferred with the 0.050 inch.

The column of solder 7 may comprise any solder medium which has properties conductive to forming an electrical and a mechanical connection between the electrical connector 2 and the substrate 20. Preferably, the column of solder 7 is an electrically conductive material. Preferably, the solder column 8 is a relatively high melting point solder having a melting point greater than about 183° C. Preferably the column of solder 7 is a 90Pb 10Sn alloy. The 90Pb 10Sn alloy preferably keeps some mechanical properties between the temperatures of 183° C. and 213° C and does not become completely liquidious until it reaches a temperature greater than about 213° C.

Referring back to FIGS. 1, 2 and 4, the substrate 20 is provided with a plurality of electrically conductive contact pads 21 (or alternatively vias or traces) adapted for receiving a solder column 8. The contact pads 21 are adapted for completing an electrical path between the electrical connector 2 and the substrate 20 and also for forming a mechanical connection between a contact pad 21 and a solder column 8. In a preferred embodiment, the contact pads 21 are formed from a copper material.

The connection between the solder column 8 and the substrate 20 is accomplished using an attachment medium 22 which mechanically and electrically connects the electrical connector 2 to a substrate 20. Preferably, a solder medium or a resin flux medium is used to form the attachment medium 22. Even more preferably, an eutectic solder material having a relatively low melting point with respect to the melting point of the material of the solder column 8 is used. The terminal 5 has a melting temperature greater than the melting point of the solder column 8, and solder column 8 has a melting point greater than the relatively low melting point of the attachment solder 22 which completes the connection between the connector 2 and the substrate 20. The low melting point solder 22 actually forms the final connection 24 between the solder column 8 and the contact pad 21. An activation material, such as a flux or a mild acid, may also be used to help clean the surface of the contact pad 21.

The connection of the solder column 8 to the substrate 20 is accomplished using conventional methods. In one preferred method of attaching the connector 2 to the substrate 20, the solder medium 22 is disposed between the tip 12 of the solder column 8 and the contact pad 21 of the substrate 20. The solder column 8 is positioned over the contact pad 21. The combination is then heated to a temperature at which the low temperature solder medium 22 achieves a liquidious form. The combination is then allowed to cool to form the connection 24 between the solder column 8 and the contact pad 21. A small percentage of the high melting point solder of the solder column 8 may, on a microscopic level, form part of the connection joint 24.

Surface tension generally causes the solder 22 to ball up when it goes into a liquidious form. This causes the solder column 8 to self-center on the substrate 20 that it is attaching to. Preferably, a non-removable connection is formed between the connector 2 and the substrate 20, meaning that the connector 2 cannot be removed from the substrate 20 without damaging the solder column 8, the contact pad 21, or the connection joint 24.

FIGS. 5 through 8 show an exemplary process of attaching the column of solder 7 to the terminal tail portion 6 in accordance with the present invention. FIGS. 5 through 8 shows a fixture 30 to be used in the process of attaching a column of solder 7 to a tail 6 portion of a terminal 5 to form a solder column 8. Fixture 30 is formed having a plurality of bores, or holes, 31 that extend a predetermined depth therein. Each bore 31 has a top 32 and a bottom 33. The depth is predetermined based on the desired length 13 of the solder column 8 that is being formed.

Preferably, the fixture is designed such that the depth of one or more of the bores 31 is variable in order to control the final coplanarity of the connector 2 in relation to the surface of the substrate 20. The coplanarity may be established such that it matches the surface contour of the substrate 20 to which it will be attached. Coplanarity means that the plane defined by the tips 12 of the solder columns 8 is coplanar with the plane defined by the surface of the substrate 20 when the connector 2 is placed on the substrate 20.

Figure 5:
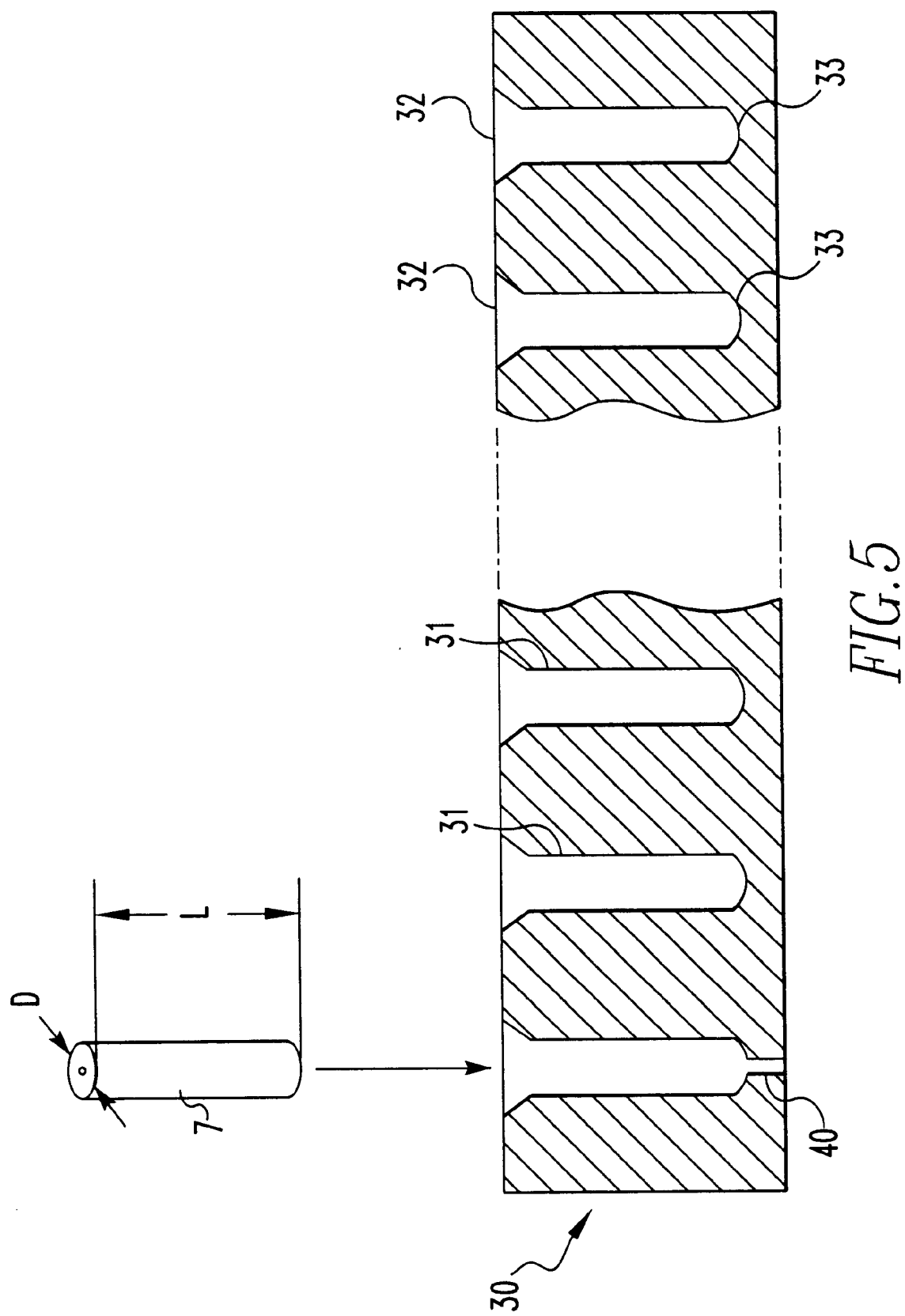
FIG. 5 is a cut-away side view of an exemplary fixture for forming the solder column of the present invention.

The bores 31 are preferably shaped to conform to the desired shape of the solder column 8. This would include the top 32 where the solder column 8 will attach to the tail 6 and also the bottom 33 which is preferably formed having a shape that is adapted for forming a connection to a particular substrate 20. As shown in FIG. 5, the top 32 is preferably formed having a flared design to allow the solder to form a better connection with the tail 6. The bottom 33 is preferably formed having a spherical shape to form a solder column 8 having a spherical shaped tip 12. Alternatively, the bottom 33 may have a flat shape.

FIG. 5 also shows an optional channel 40 that may be present in an alternative embodiment to connect bores 31 to a point outside of the fixture 30. Channel 40 provides a path for venting of the liquidious solder material during formation of the solder column 8.

As shown in FIG. 5, the method of attaching the column of solder 7 to the tail 6 portion of an electrical connector terminal 5 to form solder column 8 includes providing a fixture 30 and cutting a plurality of columns of solder 7 to a predetermined length L and a predetermined diameter D depending on the particular application. The plurality of columns of solder 7 may be a solder preform, a non-eutectic solder, or a cut wire solder. For example, a preferred application has columns of solder 7 that have a 0.020 inch diameter, and a length of either 0.050 inch or 0.087 inch. Disposing the cut columns of solder 7 into the bores 31 in fixture 30.

Figure 6:
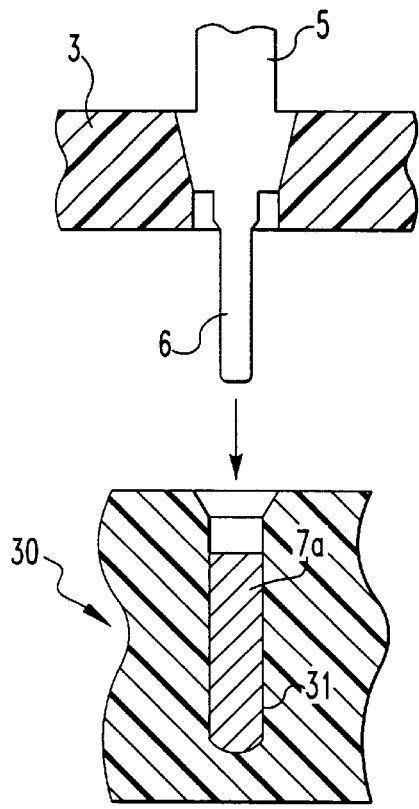
FIG. 6 is a detail of the fixture of FIG. 5 showing the tail portion of the terminal being lowered into a liquidious pool of solder.

As shown in FIG. 6, the next step of the above method is heating the fixture 30 having the cut columns of solder disposed therein to a temperature above the melting point of the solder 7 to form a liquidious pool of solder 7a in each bore 31. The temperature is below the melting point of the material of the tail 6. Preferably, the solder is a high melting point solder alloy, such as a 90PB 10Sn alloy. Even more preferably, the solder has a melting point greater than about 183° C. Thereafter the method includes providing an electrical connector 2 having a plurality of contact terminal 5 disposed therein and tail 6 portions of each terminal 5 extending through the housing 3 of the connector 2 and extending therefrom. The tails 6 are preferably a metallic material having a melting point higher than the melting point of the solder 7.

Figure 7:
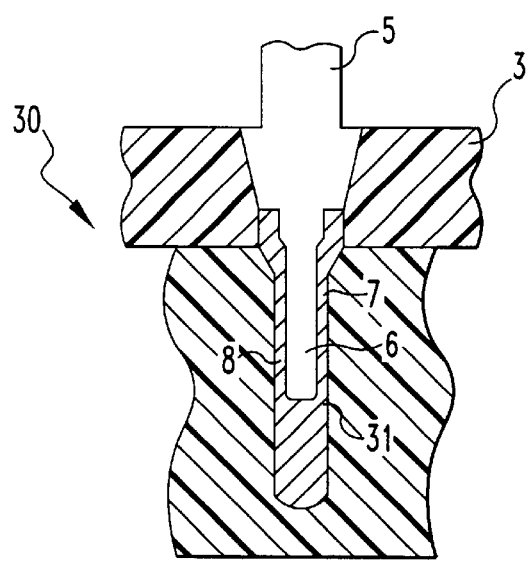
FIG. 7 is a detail of the fixture of FIG. 5 showing the solder solidifying about the tail portion of the terminal to form a solder column.

As shown in FIG. 7, the step of providing the electrical connector includes disposing the plurality of tail 6 portion into the bores 31 and the liquidious pools of solder 7a, and cooling the fixture 30 and connector 2 combination so that the solder pools 7a solidify forming a solder column 8 having the tail extending at least some distance into the solder column 8. A first length 13a is formed having the tail 6 portion that forms a core 10 of the solder column 8. A second length 13b is formed having solder material 7 only. Removing the electrical connector 2 having a plurality of solder columns 8 depending therefrom from the fixture 30.

The lengths of the solder columns 8 may be varied by setting the depth of one or more of the bores 31 (as described more fully below) to control a final coplanarity of the connector 2, or alternatively, the tips 12 of the solder columns 8 may be sheared or cut to length to set the coplanarity for a given application. Coplanarity is defined as the plane or coplane formed by a plurality of tips 12 formed at the distal ends of each of the lengths of the solder columns 8 and the plane defined by the surface of the substrate 20 when the connector having solder columns 8 is disposed over the substrate 20. Preferably, the coplanarity of the tips 12 is adapted for each application to correspond to the coplanarity of the surface of the substrate 20 to which the connector 2 will be affixed.

Figure 8A:
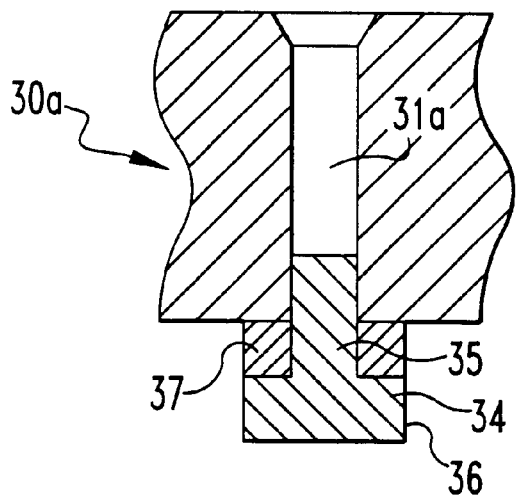
FIGS. 8A and 8B show alternate configurations of the bores of the fixture of FIG. 5.
Figure 8B:
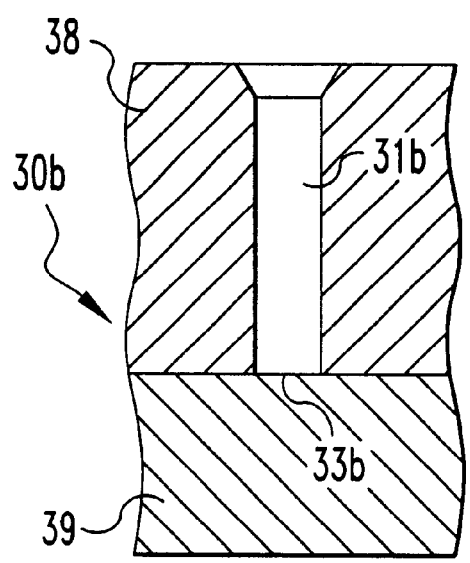

FIGS. 8A and 8B show alternative configurations of fixture 30 and bottom 33. FIG. 8A shows fixture 30a having a bore 31a that extends all the way through the fixture 30a. A pin structure 34 is provided having a body 35 that extends upward into bore 31a and a head 36 attached to the body 35. The pin body 35 is sized to have a diameter slightly smaller than the diameter of bore 31a. The fit of pin body 35 into bore 31a is such that minimal or no leakage of liquid from bore 31a above pin body 35 occurs. A seal 37 may also be provided to contain any leakage of liquid solder pass pin body 35. Seal 37 is preferably formed having a circular donut like shape with an inner diameter slightly smaller than the pin body 35 diameter and an outer diameter greater than the diameter of bore 31a. The pin structure 34 provides a control feature for varying the depth of each bore 31a by sliding the pin structure 34 into or out of bore 31a, thereby allowing for control of the final length of solder column 8 and the coplanarity of the connector. The pin structure 34 also provides an ejection feature that facilitates removal of the completed solder column 8 and for cleaning the fixture 30.

FIG. 8B shows a two piece laminated fixture 30b for producing flat bottom 33b solder columns 8. The two piece fixture 30b preferably is a laminated structure including a first piece 38 having a plurality of bores 31b formed therein that pass through the first piece 38 and a second piece 39 that is disposed under the first piece 38 to cover and close bore 31b. This laminated flat bottom design is less expensive than the fixture 30 having a spherical bottom 33 and also the fixture 30a having a pin structure 34. This provides benefits in tooling, fixture manufacturing, and design. This laminated design of fixture 30b also provides for adjustment of the length of the solder column 8, facilitates ejection of the solder column 8 from the fixture 30b, and assists in the cleaning of the bores 31b of fixture 30b.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapted for forming a mechanical and an electrical connection to a substrate, such as a printed circuit board, said connector comprising:

a housing having a mounting surface;

a plurality of electrical contact terminals disposed in said housing, wherein each of said contact terminals comprises a tail formed at a distal end of said terminal, each said tail passing through and extending from said mounting surface of said housing; and a plurality of solder columns, wherein each solder column is attached to a tail such that at least a portion of said tail extends a predetermined distance into said solder column.

2. The apparatus of claim 1 wherein said solder column length is adapted to form a plurality of tips at a distal end of each of said solder columns, wherein said tips define a plane that is coplanar with a plane defined by a mating surface of said substrate.

3. The apparatus of claim 1 wherein said solder column comprises a relatively high melting point solder alloy having a melting point greater than a relatively low melting point solder paste.

4. The apparatus of claim 1 wherein said solder column is a 90Pb 10Sn solder alloy.

5. The apparatus of claim 1 wherein said solder columns have an overall length, a first length, and a second length, wherein said first length includes that portion of said solder column having both said tail and said column of solder, and said second length includes said column of solder only, and wherein said second length is greater than said first length.

6. The apparatus of claim 1 wherein said tail extends into said solder column a distance between about 5 percent to about 20 percent of an overall length of said solder column.

7. The apparatus of claim 1 wherein said electrical connector comprises a connector having a pitch of about 1.00 mm to about 1.27 mm, and said solder column has a diameter of about 0.020 inch to about 0.0225 inch and a length of about 0.050 inch to about 0.087 inch.

8. The apparatus of claim 1 wherein said solder column comprises a column of solder disposed about said tail such that a center longitudinal axis of said tail forms part of a center longitudinal axis of said solder column, said tail extending into said column of solder a predetermined distance to form a core of said solder column.

9. The apparatus of claim 8 wherein an overall length of each of said solder columns includes a first length comprising said tail surrounded by said solder and a second length comprising solder only, and wherein said second length makes up a greater percentage of said overall length of said solder column.

10. The apparatus of claim 1 further comprising a relatively low melting point solder paste having a melting point less than said relatively high melting point solder alloy, wherein said solder column is attached to said substrate by said low melting point solder paste.

11. The apparatus of claim 10 wherein said low melting point solder paste is an eutectic solder material.

12. The apparatus of claim 1 wherein said tail comprises a metallic material, said metal tail being more rigid than said column of solder, said tail forming a rigid core of said solder column, wherein said rigid core of said solder column is constructed to improve one or more mechanical properties of said connection between connector and said substrate, and wherein said column of solder of said solder column is constructed to improve a compliance between said connector and said substrate.

13. The apparatus of claim 12 wherein said material of said terminal tail has a melting point greater than a melting point of said material of said solder columns.

* * * * *